(12) United States Patent
Yasuda et al.

(10) Patent No.: US 8,821,768 B2
(45) Date of Patent: Sep. 2, 2014

(54) BONDING METHOD AND BONDING MATERIAL USING METAL PARTICLE

(75) Inventors: Yusuke Yasuda, Hitachi (JP); Toshiaki Morita, Hitachi (JP); Eiichi Ide, Hitachi (JP); Hiroshi Hozoji, Hitachiota (JP); Toshiaki Ishii, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/965,973

(22) Filed: Dec. 28, 2007

(65) Prior Publication Data
US 2008/0156398 A1 Jul. 3, 2008

(30) Foreign Application Priority Data

Dec. 28, 2006 (JP) ................. 2006-353648

(51) Int. Cl.
| | |
|---|---|
| *H01B 1/22* | (2006.01) |
| *H01L 23/00* | (2006.01) |
| *B23K 35/36* | (2006.01) |
| *B23K 35/34* | (2006.01) |
| *H01L 25/07* | (2006.01) |
| *H01L 23/31* | (2006.01) |

(52) U.S. Cl.
CPC ....... *B23K 35/34* (2013.01); *H01L 2924/13091* (2013.01); *H01L 24/27* (2013.01); *H01L 2224/48227* (2013.01); *H01L 2224/83455* (2013.01); *H01L 24/45* (2013.01); *H01L 2224/29139* (2013.01); *H01L 2224/32175* (2013.01); *H01L 2224/45015* (2013.01); *H01L 2924/01047* (2013.01); *H01L 2224/83986* (2013.01); *H01L 2224/83447* (2013.01); *H01L 2924/10253* (2013.01); *H01L 2924/01019* (2013.01); *H01L 2224/32245* (2013.01); *H01L 2924/01078* (2013.01); *H01L 2924/01028* (2013.01); *H01L 2224/2919* (2013.01); *H01L 2924/19043* (2013.01); *H01L 24/29* (2013.01); *H01L 2924/0132* (2013.01); *H01L 2924/01049* (2013.01); *B23K 35/3612* (2013.01); *H01L 2224/83203* (2013.01); *H01L 2924/01082* (2013.01); *H01L 2224/83444* (2013.01); *H01L 2924/01024* (2013.01); *H01L 2224/04026* (2013.01); *H01L 2224/2731* (2013.01); *H01L 2924/0541* (2013.01); *H01L 2924/0105* (2013.01); *H01L 2224/45124* (2013.01); *H01L 2224/29294* (2013.01); *H01L 2924/15747* (2013.01); *H01L 2924/01005* (2013.01); *H01L 2224/48739* (2013.01); *H01L 2224/05639* (2013.01); *H01L 2224/83192* (2013.01); *H01L 2924/09701* (2013.01); *H01L 2924/01033* (2013.01); *H01L 2924/0665* (2013.01); *H01L 2224/29101* (2013.01); *H01L 2924/014* (2013.01); *H01L 2224/73265* (2013.01); *H01L 2924/01073* (2013.01); *H01L 24/30* (2013.01); *H01L 2224/29387* (2013.01); *H01L 2924/19041* (2013.01); *H01L 2224/30181* (2013.01); *H01L 2924/01013* (2013.01); *H01L 23/3107* (2013.01); *H01L 2924/01079* (2013.01); *H01L 2924/01077* (2013.01); *H01L 2924/01074* (2013.01); *H01L 2924/01014* (2013.01); *H01L 2924/01076* (2013.01); *H01L 24/32* (2013.01); *H01L 2924/01044* (2013.01); *H01L 2924/16195* (2013.01); *H01L 2924/01045* (2013.01); *H01L 2924/19107* (2013.01); *H01L 2224/29393* (2013.01); *H01L 2224/8384* (2013.01); *H01L 2224/83191* (2013.01); *H01L 2224/45147* (2013.01); *H01L 2224/33181* (2013.01); *H01L 2224/29111* (2013.01); *H01L 2924/01006* (2013.01); *H01L 2224/32225* (2013.01); *H01L 2924/0103* (2013.01); *H01L 2224/48247* (2013.10); *H01L 24/33* (2013.01); *H01L 2924/19105* (2013.01); *H01L 24/83* (2013.01); *H01L 2224/85205* (2013.01); *H01L 2224/8584* (2013.01); *H01L 2924/01029* (2013.01); *H01L 25/072* (2013.01)
USPC ............. 252/520.3; 252/518.1; 252/519.3; 148/516; 148/527; 148/528

(58) Field of Classification Search
CPC ............ H01B 1/02; H01B 1/22; B23K 35/34; B23K 35/3612
USPC ......... 252/500, 518.1, 520.3, 519.3; 148/516, 148/527, 528
See application file for complete search history.

(56) References Cited

U.S. PATENT DOCUMENTS

| | | | |
|---|---|---|---|
| 6,878,184 B1 | 4/2005 | Rockenberger et al. | |
| 7,528,485 B2 | 5/2009 | Morita et al. | |

(Continued)

FOREIGN PATENT DOCUMENTS

| | | |
|---|---|---|
| JP | 2003-308731 | 10/2003 |
| JP | 2003-309352 | 10/2003 |

(Continued)

OTHER PUBLICATIONS

Machine translation of JP2003-309352.*

(Continued)

*Primary Examiner* — Mark Kopec
*Assistant Examiner* — Haidung Nguyen
(74) *Attorney, Agent, or Firm* — Antonelli, Terry, Stout & Kraus, LLP.

(57) ABSTRACT

It is an object of this invention to provide a bonding material capable of realizing bonding by metallic bonding at a bonding interface at a lower temperature compared to a bonding material using a metal particle having an average particle diameter of not more than 100 nm and a bonding method. There is provided a bonding material including a metal particle precursor being at least one selected from the group consisting of a particle of a metal oxide, a particle of a metal carbonate, and a particle of a metal carboxylate and having an average particle diameter of 1 nm to 50 μm and a reducing agent composed of an organic substance, wherein the content of the metal particle precursor is more than 50 parts by mass and not more than 99 parts by mass per 100 parts by mass of the bonding material.

14 Claims, 14 Drawing Sheets

(56) References Cited

U.S. PATENT DOCUMENTS

| | | | |
|---|---|---|---|
| 2003/0124259 A1* | 7/2003 | Kodas et al. | 427/376.6 |
| 2004/0259007 A1 | 12/2004 | Takahashi et al. | |
| 2005/0069648 A1 | 3/2005 | Maruyama | |
| 2005/0116203 A1* | 6/2005 | Takahashi et al. | 252/500 |
| 2006/0022326 A1 | 2/2006 | Morita et al. | |
| 2006/0267218 A1 | 11/2006 | Hozoji et al. | |
| 2007/0160837 A1* | 7/2007 | Chikamori et al. | 428/403 |
| 2007/0216012 A1 | 9/2007 | Hozoji et al. | |
| 2008/0160183 A1* | 7/2008 | Ide et al. | 427/126.5 |

FOREIGN PATENT DOCUMENTS

| | | |
|---|---|---|
| JP | 2004-107728 | 4/2004 |
| JP | 2004-335349 | 11/2004 |
| JP | 2006-41008 | 2/2006 |
| JP | 2006-041362 | 2/2006 |
| JP | 2006-202586 | 8/2006 |
| WO | WO 03/051562 | 6/2003 |
| WO | WO 03/056574 | 7/2003 |
| WO | WO 03/085052 A1 | 10/2003 |

OTHER PUBLICATIONS

English language translation of JP2003-309352, 2012.*
JP Office Action of Appln. No. 2011-241832 dated Feb. 19, 2013.
Japanese Notice of Reasons for Rejection of Appln. No. 2007-335517 dated Aug. 29, 2011 with partial English translation.

* cited by examiner

BONDING METHOD AND BONDING MATERIAL USING METAL PARTICLE

BACKGROUND OF THE INVENTION

1. Field of the Invention

The present invention relates to a bonding material in a semiconductor module and a method for manufacturing the bonding material.

2. Background Art

In a non-insulated semiconductor apparatus which is one of power semiconductor apparatuses used in an inverter or the like, a member which fixes a semiconductor device also serves as an electrode of the semiconductor apparatus. For example, in a semiconductor apparatus in which a power transistor is mounted on a fixed member using a Sn—Pb soldering material, the fixed member (base material) serves as a collector electrode of the power transistor. When the semiconductor apparatus is in operation, a current of several amperes or more flows through the collector electrode portion, and the transistor chip generates heat. To avoid destabilization of characteristics and reduction in lifetime caused by the heat generation, the heat dissipation and long-term reliability (heat resistance) of a soldering portion need to be ensured. A material with high heat dissipation is required to ensure the heat resistance and heat dissipation of the soldering portion.

It is necessary also for an insulated semiconductor apparatus to efficiently dissipate heat generated when the semiconductor apparatus is in operation out of the semiconductor apparatus and ensure the connection reliability of a soldering portion in order to safely and stably operate a semiconductor device.

As a connecting material with high heat dissipation and reliability, there is known a conductive adhesive using a conductive composition including a particulate silver compound (e.g., JP Patent Publication (Kokai) No. 2003-309352 A (2003), hereinafter referred to as Patent Document 1). However, since a method using such a conductive adhesive uses a binder as a bonding mechanism at an interface, it is inferior in heat dissipation and bonding reliability to a method for achieving metallic bonding at an interface.

It is known that if the particle diameter of particles of a metal decreases to 100 nm or less, and the number of constituent atoms decreases, the ratio of surface area to volume of the particles rapidly increases, and the melting point and sintering temperature become much lower than those of the metal in bulk state. There is known bonding utilizing the property of sintering at a low temperature, i.e., bonding by using metal particles whose surfaces are coated with an organic substance and which have an average particle diameter of 100 nm or less, decomposing the organic substance by heating, and sintering the metal particles (e.g., JP Patent Publication (Kokai) No. 2004-107728 A (2004), hereinafter referred to as Patent Document 2). After bonding by the bonding method, metal particles have changed into bulk metal, and metallic bonding is achieved at a bonding interface. The method thus has very high heat resistance, reliability, and heat dissipation. Although solder is under pressure to be lead-free, there is as yet no material to replace high-temperature solder. Since use of hierarchical soldering is indispensable for mounting, there is a demand for the advent of a material to replace high-temperature solder. Therefore, the bonding technique is expected as a material to replace high-temperature solder.

Note that JP Patent Publication (Kokai) No. 2006-41008 A (2006) (hereinafter referred to as Patent Document 3) discloses that connection reliability at an interface and closeness of a bonding layer are ensured by producing silver nanoparticles during heating at the time of bonding to fill interstices in conductive resin on the spot, which makes it possible to improve conductivity and electrical connection reliability.

In the bonding method using metal particles having an average particle diameter of 100 nm or less disclosed in, e.g., Patent Document 2, since bonding is achieved by metallic bonding at a bonding interface, as described above, the bonding method has high heat resistance, reliability, and high heat dissipation. However, since very fine metal particles having an average particle diameter of 100 nm or less tend to cohere, it is necessary to form a protective film made of an organic substance in order to stabilize such metal particles. Although the protective film of the organic substance needs to be removed at the time of bonding, it is difficult to completely remove the protective film by heating at a low temperature, and sufficient bonding strength is hard to achieve. If a protective film made of an organic substance for metal particles is molecularly designed to decompose at a low temperature, metal particles produced at a room temperature of 20 to 30° C. immediately cohere, and thus it is difficult to produce metal particles which can sinter at a low temperature. In addition, since production of metal particles having an average particle diameter of 100 nm or less involves troublesome work such as removal of impurities after the production, reducing the cost of a bonding material is difficult. As described above, a bonding method using metal particles having an average particle diameter of 100 nm or less has practical problems remaining to be solved such as production of metal particles, removal of impurities from and storage of metal particles after production, and handling of metal particles.

In a bonding method disclosed in Patent Document 3, 5 to 50 parts by mass of tertiary fatty acid silver salt per 100 parts by mass of a conductive composition is mixed in the conductive composition, silver nanoparticles are produced on the spot at the time of bonding, and interstices in resin is filled after thermal hardening, thereby improving conductivity and the like. However, the volume of tertiary fatty acid silver salt, which is a precursor of a silver nanoparticle, shrinks, the content of silver in the tertiary fatty acid silver salt is not high, and the volatilization temperature of an organic substance generated when the tertiary fatty acid silver salt decomposes is not low. Accordingly, it is difficult to use more than 50 parts by mass of the silver nanoparticle precursor per 100 parts by mass of the conductive composition in a bonding material. Additionally, since a heating time of 10 minutes or more is required, shortening of process time is difficult. Moreover, since adhesion is achieved mainly by using a binder at an interface, as in Patent Document 1, it is difficult to acquire a close sintered silver layer and achieve metallic bonding at an interface after bonding.

SUMMARY OF THE INVENTION

The present invention has been made in consideration of the above-described problems, and has as its object to provide a bonding material capable of realizing bonding by metallic bonding at a bonding interface at a lower temperature compared to a bonding material using a metal particle having an average particle diameter of not more than 100 nm and a bonding method.

It has been found that addition of a reducing agent composed of an organic substance to a metal particle precursor being at least one selected from the group consisting of a particle of a metal oxide, a particle of silver carbonate, and a particle of silver acetate and having an average particle diameter of not less than 1 nm and not more than 50 μm causes the metal particle precursor to be reduced at a lower temperature than when the metal particle precursor alone is thermally decomposed to produce a metal particle having an average particle diameter of not more than 100 nm. It has also been found at this time that application of pressure between members to be bonded using a bonding material containing more than 50 parts by mass and not more than 99 parts by mass of a metal particle precursor being at least one selected from the group consisting of a particle of a metal oxide, a particle of a metal carbonate, and a particle of a metal carboxylate and having an average particle diameter of not less than 1 nm and not more than 50 μm per 100 parts by mass of the bonding material makes it possible to acquire a closer sintered silver than that using a bonding material containing only not more than 50 parts by mass of the metal particle precursor and achieve metallic bonding at a bonding interface.

In other words, according to the present invention, there is provided a bonding material comprising a metal particle precursor being at least one selected from the group consisting of a particle of a metal oxide, a particle of a metal carbonate, and a particle of a metal carboxylate and having an average particle diameter of not less than 1 nm and not more than 50 μm and a reducing agent composed of an organic substance.

There is also provided a bonding method comprising arranging a bonding material comprising a metal particle precursor being at least one selected from the group consisting of a particle of a metal oxide, a particle of a metal carbonate, and a particle of a metal carboxylate and having an average particle diameter of not less than 1 nm and not more than 50 μm and a reducing agent composed of an organic substance between an electrode of a semiconductor device and a metal member, and bonding the electrode of the semiconductor device and the metal member together by heating and pressurization.

According to the present invention, it is possible to provide a bonding material and a bonding method capable of realizing bonding by metallic bonding at a bonding interface at a lower temperature compared to a bonding material using a metal particle having an average particle diameter of not more than 100 nm.

Figure 1:
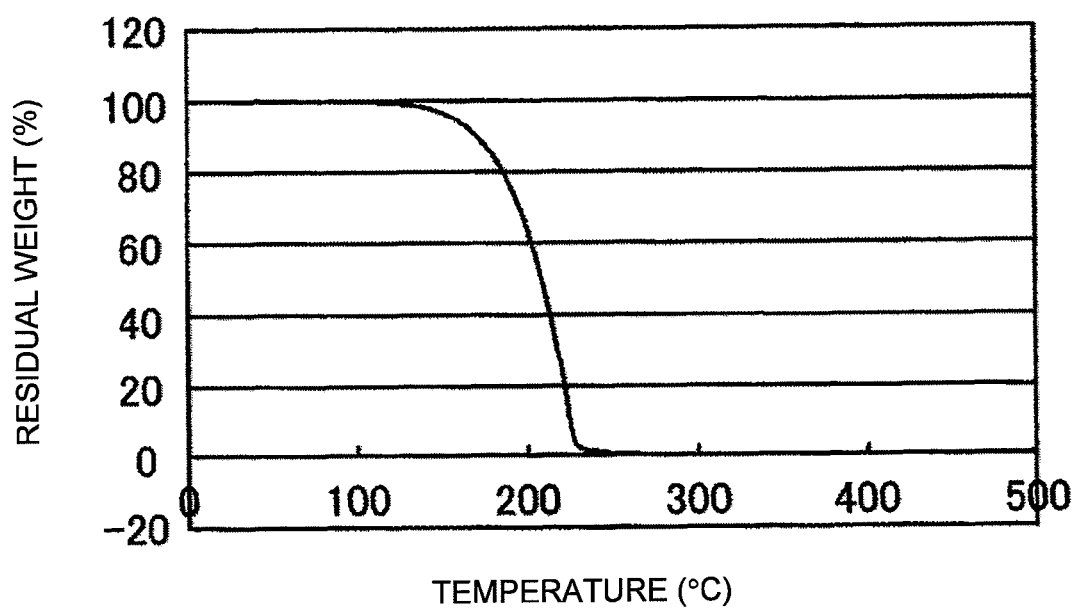
FIG. 1 is a graph showing the result of measuring the rate of weight loss versus temperature of myristyl alcohol.

201 Members to be bonded
202 Silver oxide particles
203 Myristyl alcohol (Reducing agent)
204 Sintered silver layer
301, 401 Semiconductor device
302, 402 Ceramic insulating substrate
302a Copper plate
303, 403 Base material
304 Epoxy resin case
305 Bonding wires
306 Epoxy resin lid
307 Silicone gel resin
308, 309 Bonding layer
310 Terminal
311 Thermistor device
402a, 402b Wire
431 Connecting terminal

DETAILED DESCRIPTION OF THE PREFERRED EMBODIMENTS

An embodiment of the present invention will be concretely described below.

The present invention performs bonding by using a bonding material including a metal particle precursor being at least one selected from the group consisting of a particle of a metal oxide, a particle of a metal carbonate, and a particle of a metal carboxylate and having an average particle diameter of not less than 1 nm and not more than 50 μm and a reducing agent composed of an organic substance and utilizing a phenomenon in which after metal particles having particle diameters of 100 nm or less are produced at the time of heating and pressurization during bonding, the metal particles cohere and change into bulk metal. Pressurization at the time of bonding causes the organic material to be eliminated from a bonding layer, thus resulting in acquisition of a close silver layer and achievement of metallic bonding at an interface.

In the presence of a reducing agent, metal particles having particle diameters of 100 nm or less start to be produced from each of a metal oxide, a metal carbonate, and a metal carboxylate at 200° C. or less. Accordingly, it is possible to achieve bonding even at a low temperature of 200° C. or less where bonding cannot be achieved when metal particles which have particle diameters of 100 nm or less and whose surfaces are coated with an organic substance are used in a bonding material. This makes it possible to achieve firm bonding having a shear strength of 5 MPa or more at a bonding interface of a bonding layer even at a temperature of 250°

C. or less where firm bonding cannot be easily achieved by the prior art and to reduce deterioration in a chip peripheral member at the time of bonding much more than bonding at 300° C. or more. As described above, low-temperature bonding is possible, and the present invention can be applied, for example, to bonding of an electrode provided in an active area of a semiconductor device to a mounting portion of a wiring board on which the semiconductor device is to be mounted. Since a bonding layer after bonding has higher heat resistance than a conventional solder material, problems such as melting of a semiconductor device mounting portion do not occur in a thermal process such as secondary mounting, and it is possible to achieve reduction in size and increase in reliability of a semiconductor apparatus.

Since metal particles having particle diameters of 100 nm or less are produced on the spot during bonding, it is unnecessary to produce metal particles whose surfaces are protected by an organic substance. This makes it possible to simplify the manufacture of a bonding material and a bonding process and achieve significant reduction in the cost of the bonding material.

A metal oxide, a metal carbonate salt, and a metal carboxylate are designated as candidates for a metal particle precursor having an average particle diameter of 1 nm or more and 50 μm or less because the metal content of each compound as the metal particle precursor is high. When the metal content is high, since the degree of volume shrinkage at the time of bonding is low, and oxygen is generated at the time of decomposition, oxidative decomposition of an organic material is facilitated. A metal particle precursor is a substance from which a metal particle having a particle diameter of 100 nm or less is produced after being mixed with a reducing agent and being reduced by heating and refers to any of a metal oxide, a metal carbonate salt, and a metal carboxylate in the present invention.

The average particle diameter of a metal particle precursor to be used is designated to be 1 nm or more and 50 μm or less. This is because if the average particle diameter is larger than 50 μm, metal particles having particle diameters of 100 nm or less are hard to be produced during bonding, the space between particles is large, and acquisition of a close bonding layer is difficult. The average particle diameter is also designated to be 1 nm or more because it is difficult to actually produce a metal particle precursor having an average particle diameter of less than 1 nm. In the present invention, since metal particles having particle diameters of 100 nm or less are produced during bonding, the average particle diameter of the metal particle precursor need not be designated to be 100 nm or less. It is preferable to use a particle having a particle diameter of 1 to 50 μm in terms of production, handleability, and long-term storage stability of a metal particle precursor. It is also possible to use a metal particle precursor having an average particle diameter of 1 to 100 nm in order to acquire a closer bonding layer.

Examples of a metal oxide include silver oxide ($Ag_2O$ or $AgO$), copper oxide, and gold oxide, examples of a metal carbonate salt include silver carbonate, and examples of a metal carboxylate include silver acetate. It is possible to use a bonding material composed of at least one selected from the group consisting of these metal compounds or a mixture of at least two of them. Among the metal compounds, in the case of metal oxides of gold oxide, silver oxide ($Ag_2O$ or $AgO$), and copper oxide, only oxygen is generated at the time of reduction, a residue tends not to remain after bonding, and the rate of volume decrease is very low. Accordingly, it is preferable to use a metal oxide.

The content of a metal particle precursor is preferably more than 50 parts by mass and 99 parts by mass or less per 100 parts of a bonding material. This is because if the metal content in a bonding material is high, the amount of a residue of an organic substance left after bonding at a low temperature is small. This makes it possible to acquire a close sintered layer at a low temperature and achieve metallic bonding at a bonding interface, achieve improvement in bonding strength, and acquire a bonding layer with high heat dissipation and high heat resistance.

A mixture of at least one selected from the group consisting of an alcohol, a carboxylic acid, and an amine can be used as a reducing agent composed of an organic substance.

Examples of an available compound having an alcohol group include an alkyl alcohol. Examples of an alkyl alcohol include ethanol, propanol, butyl alcohol, pentyl alcohol, hexyl alcohol, heptyl alcohol, octyl alcohol, nonyl alcohol, decyl alcohol, undecyl alcohol, dodecyl alcohol, tridecyl alcohol, tetradecyl alcohol, pentadecyl alcohol, hexadecyl alcohol, heptadecyl alcohol, octadecyl alcohol, nonadecyl alcohol, and icosyl alcohol. The compound is not limited to a primary alcohol, and a secondary alcohol such as ethylene glycol or triethylene glycol, a tertiary alcohol, an alkane diol, or an alcohol compound having a cyclic structure may be used. Alternatively, ethylene glycol, triethylene glycol, or a compound having many alcohol groups such as citric acid, ascorbic acid, or glucose may be used.

Examples of an available compound having a carboxylic acid group include an alkylcarboxylic acid. Examples of an alkylcarboxylic acid include butanoic acid, pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, hexadecanoic acid, heptadecanoic acid, octadecanoic acid, nonadecanoic acid, and icosanoic acid. Like the above-described case of alcohol, the compound is not limited to a primary carboxylic acid, a secondary carboxylic acid, a tertiary carboxylic acid, a dicarboxylic acid, or a carboxylic compound having a cyclic structure may be used.

Examples of an available compound having an amino group include an alkylamine. Examples of an alkylamine include butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, nonadecylamine, and icodecylamine. The compound having an amino group may have a branched structure. Examples of such a compound include 2-ethylhexylamine and 1,5-dimethylhexylamine. The compound is not limited to a primary amine, and a secondary amine or a tertiary amine may be used. Alternatively, such an organic substance may be cyclic.

A reducing agent to be used is not limited to an organic substance containing any of the above-described alcohols, carboxylic acids, and amines. An organic substance having an aldehyde group, ester group, sulfanyl group, ketone group, or the like or a compound containing an organic substance such as a metal carboxylate may be used. Although a metal carboxylate is used as a metal particle precursor, it contains an organic substance and thus may be used as a reducing agent for particles of a metal oxide. Particles of a reducing agent having a melting point lower than a bonding temperature cohere at the time of bonding to cause voids. In contrast, for example, a metal carboxylate does not melt by heating at the time of bonding and thus can be used to reduce voids. A metal compound containing an organic substance other than metal carboxylates may be used as the reducing agent.

Since a reducing agent such as ethylene glycol or triethylene glycol which is liquid at 20 to 30° C. reduces silver oxide ($Ag_2O$) or the like to silver if the reducing agent is mixed with the silver compound and is left standing for a day, it needs to be used immediately after mixing. On the other hand, even if myristyl alcohol, laurylamine, ascorbic acid, or the like, which is solid in a temperature range of 20 to 30° C., is left standing together with a metal oxide or the like for about a month, a reaction between the reducing agent and the metal compound does not advance so far. Accordingly, myristyl alcohol, laurylamine, ascorbic acid, and the like are excellent in storage stability, and it is preferable to use any of these substances if it is to be stored for a long time after mixing. Since a reducing agent to be used serves as a protective film for refined metal particles having particle diameters of 100 nm or less after it reduces a metal oxide or the like, the carbon number of the reducing agent preferably falls within a certain range. More specifically, the carbon number is preferably 2 or more and 20 or less. This is because if the carbon number is less than 2, grain growth occurs upon production of metal particles to make production of metal particles having particle diameters of 100 nm or less difficult. It is also because if the carbon number is more than 20, the decomposition temperature is higher, and metal particles are harder to sinter, thus resulting in reduction in bonding strength.

The amount used of a reducing agent only needs to fall within a range of 1 part by mass or more to 50 parts by mass or less per 100 parts by mass of a metal particle precursor. This is because if the amount of the reducing agent is less than 1 part by mass, the amount is not sufficient to completely reduce the metal particle precursor in a bonding material and produce metal particles. It is also because if the amount used is more than 50 parts by mass, the amount of a residue left after bonding is large, and it is difficult to achieve metallic bonding at an interface and closeness of a bonding silver layer. When the reducing agent is consisted only of an organic substance, the rate of weight loss versus temperature of the reducing agent at the time of heating at up to 400° C. is preferably 99% or more. This is because if the decomposition temperature of the reducing agent is high, the amount of a residue left after bonding is large, and it is difficult to achieve metallic bonding at an interface and closeness of a bonding silver layer. Assume here that measurement of a rate of weight loss versus temperature at the time of heating at up to 400° C. is performed at a rate of 10° C./min in the atmosphere, using a commercially available apparatus such as TG/DTA6200 made by Seiko Instruments Inc. or TGA-50 made by SHIMADZU CORPORATION which can perform thermogravimetric measurement.

A combination of a metal particle precursor and a reducing agent composed of an organic substance is not particularly limited as far as metal particles can be produced by mixing them. A combination from which metal particles are not produced at room temperature is preferable in terms of the stability of storage as a bonding material.

It is possible to mix relative large metal particles having an average particle diameter of 50 to 100 μm into a bonding material. This is because metal particles having particle diameters of 100 nm or less produced during bonding function to sinter metal particles having an average particle diameter of 50 to 100 μm. Alternatively, metal particles having particle diameters of 100 nm or less may be mixed in advance. Examples of the material for metal particles include gold, silver, and copper. Other than the metals, at least one metal of platinum, palladium, rhodium, osmium, ruthenium, iridium, iron, tin, zinc, cobalt, nickel, chromium, titanium, tantalum, tungsten, indium, silicon, aluminum, and the like or an alloy of at least two of the metals may be used.

Although a bonding material used in the embodiment may include only a metal particle precursor and a reducing agent composed of an organic substance, a solvent may be added when the bonding material is used in paste form. If the reducing agent is to be used immediately after mixing, an alcohol such as methanol, ethanol, propanol, ethylene glycol, triethylene glycol, or terpineol or the like which has a reductive effect may be used as the reducing agent. On the other hand, if the reducing agent is to be stored for a long time, it is preferable to use a substance such as water, hexane, tetrahydrofuran, toluene, or cyclohexane which has a weak reductive effect at room temperature. If a substance such as myristyl alcohol which tends not to be reduced at room temperature is used as the reducing agent, long-term storage is possible. In contrast, if a substance such as ethylene glycol which has a strong reductive effect is to be used, it is preferable to mix the substance with the metal particle precursor before use.

To improve the dispersibility of a metal particle precursor into a solvent, a dispersing agent may be used as needed, and a particle of the metal particle precursor may be coated with an organic substance. As a dispersing agent to be used in the present invention, it is possible to use a polymeric dispersing agent, such as any of DISPERBYK-160, DISPERBYK-161, DISPERBYK-162, DISPERBYK-163, DISPERBYK-166, DISPERBYK-170, DISPERBYK-180, DISPERBYK-182, DISPERBYK-184, and DISPERBYK-190 (made by BYK-Chemie GmbH), MEGAFACE F-479 (made by DAINIPPON INK AND CHEMICALS, INCORPORATED), and any of SOLSPERSE 20000, SOLSPERSE 24000, SOLSPERSE 26000, SOLSPERSE 27000, and SOLSPERSE 28000 (made by Avecia Biologics Limited), which is a commercially available dispersing agent, in addition to polyvinyl alcohol, polyacrylnitrile, polyvinyl pyrrolidone, and polyethylene glycol. The amount used of such a dispersing agent for a metal particle precursor is set to be 0.01 wt % or more and 45 wt % or less of a bonding material.

A resin composed of scaly silver and thermosetting resin may be mixed in the above-described bonding materials. Examples of the thermosetting resin include epoxy resin and polyimide resin. The present invention, however, is not limited to this. To achieve firm bonding by metallic bonding, the content of one selected from the group consisting of a metal oxide, a silver carbonate, and a silver acetate or a mixture of two or more selected from the group is preferably more than 50 parts by mass and 99 parts by mass or less per 100 parts by mass of a bonding material.

Examples of a method for applying a paste material include a method for applying paste to an electrode on a substrate or a connecting portion of an electronic component by ejecting the paste through a microscale nozzle by inkjet technology, a method for applying paste only to a portion in need of the paste using a metal mask or mesh mask with an opening corresponding to the portion, a method for applying paste to a portion in need of the paste using a dispenser, a method for applying water-repellent resin containing silicone, fluorine, or the like to a portion in need of the resin using a metal mask or mesh mask with an opening corresponding to the portion or applying photosensitive water-repellent resin to a substrate or electronic component and removing, by exposure and development, a portion of the resin corresponding to a portion to which paste composed of fine particles as described above and the like is to be applied, and applying the bonding paste to the portion corresponding to the opening, and a method for applying water-repellent resin to a substrate or electronic component, removing, by laser, a portion of the resin corresponding to a portion to which paste composed of metal particles as described above is to be applied, and applying the bonding paste to the portion corresponding to the opening. These application methods can be used in combination depending on the area and shape of an electrode to be bonded. If a substance such as myristyl alcohol or ascorbic acid which is solid at room temperature is used as a reducing agent, the substance may be shaped into a sheet by being mixed with a metal particle precursor and being pressurized and may be used as a bonding material.

In bonding using a bonding material according to the present invention, application of heat and pressure is indispensable to produce metal particles having particle diameters of 100 nm or less from a metal particle precursor at the time of bonding and achieve metallic bonding by fusion of the metal particles having the particle diameters of 100 nm or less while eliminating an organic substance from a bonding layer. Preferably, conditions for the bonding are 1 second to 10 minutes of heating at 40° C. or more and 400° C. or less and pressurization at more than 0 and less than 10 MPa.

Figure 14:
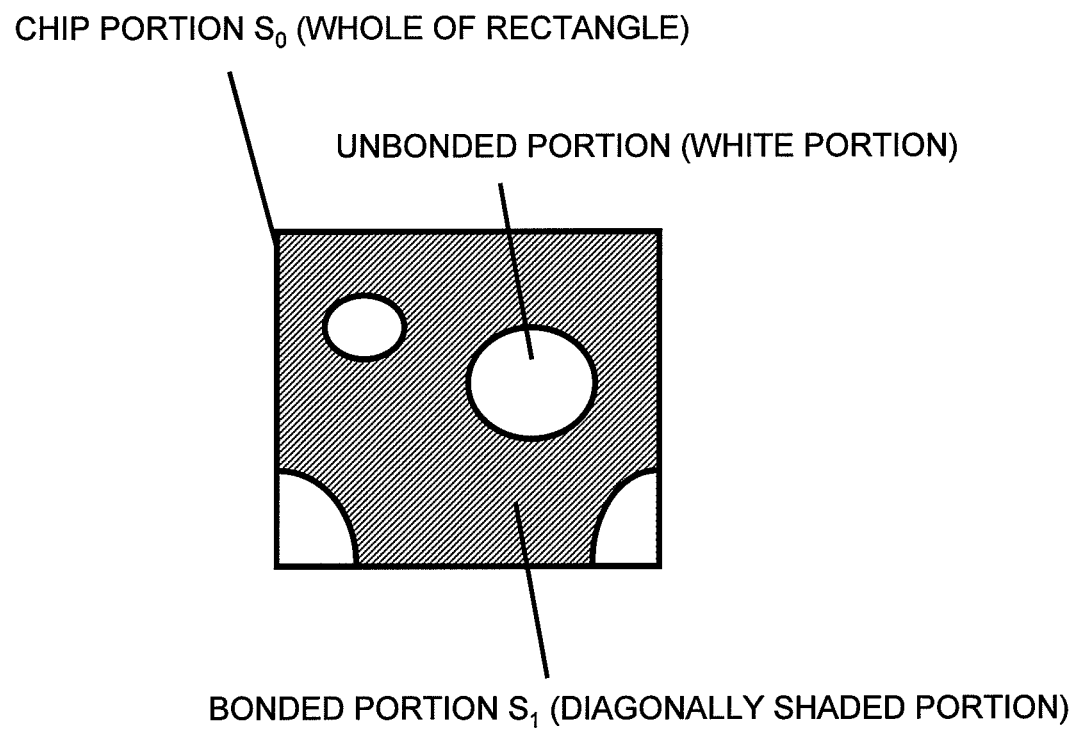
FIG. 14 is a view of a bonded portion and an unbonded portion when an ultrasonic imaging device is used.

Pressurization is indispensable at the time of bonding because increase in the area of a bonded portion and, by extension, firm bonding are not achieved without pressurization. The effect of the presence or absence of pressurization on a bonded portion area rate (%) is shown in Table 1. The term "bonded portion area" here refers to the area of a portion bonded by metallic bonding. The evaluation of the effect was performed by bonding a MOSFET device (size: 4×4×0.28 mm) which was made of Si and whose back surface was plated with silver and a lead frame whose front surface was plated with silver and which had a thickness of 0.3 mm. A sample material formed by mixing silver oxide particles and myristyl alcohol in the weight ratio of 4:1 was used as a bonding material. Conditions for bonding were: temperature, 250° C.; pressure, 2.5 MPa; and bonding time, 2 minutes and 30 seconds. For each sample obtained in this manner, a bonded portion area after bonding was evaluated using an ultrasonic imaging device, HYE-FOCUS (made by Hitachi Kenki FineTech Co., Ltd.). Three samples were evaluated for each test condition. Pieces of information on a bonded portion and an unbonded portion can be derived from an image acquired by the above-described evaluation, as shown in FIG. 14. Letting $S_0$ be the area of the whole of a chip, and $S_1$ be the area of a bonded portion, a bonded portion area rate S (%) can be represented by $S_0/S_1$. By this method, the bonded portion area rate of each sample was calculated. As can be seen from Table 1, the bonded portion area rate of each of the samples with pressurization at the time of bonding was 20% or more, and that of each of the samples without pressurization was 5% or less. The result shows that pressurization is indispensable for increasing a bonded portion area.

[Table 1]

TABLE 1

| Condition | Bonded portion area rate (%) |
| --- | --- |
| With pressurization | more than 20 |
| Without pressurization | 5 or less |

An applied pressure is designated to be more than 0 MPa because if the applied pressure is more than 0 MPa, the effect of increasing bonding strength starts to be produced, as will be described in Example 1. In the present invention, the pressure to be applied at the time of pressurization is also designated to be less than 10 MPa. This is because if a pressure of 10 MPa or more is applied, a chip to be bonded breaks, as shown in Table 2. As described above, pressurization is important to achieve sufficient bonding strength.

[Table 2]

TABLE 2

| Applied pressure (MPa) | 1.0 | 2.5 | 5.0 | 10.0 |
| --- | --- | --- | --- | --- |
| Chip state after pressurization | not broken | not broken | not broken | broken |

A conventional silver paste containing resin does not need pressurization because bonding is predominantly achieved by adhesion at an interface by resin. In the present invention, since bonding by metallic bonding is achieved at a bonding interface, pressurization is indispensable.

A heating temperature is designated to be 40° C. or more because if heating is performed at a lower temperature, it takes about 1 day for a metal particle precursor to be reduced to produce silver particles, which is unsuitable for mass production.

A heating time is designated to be 60 minutes or less because if the heating time is 60 minutes or more, it takes too much time to manufacture one product, and mass production of products is difficult.

It is conceivable that if the shear strength at a bonding interface as the bonding strength of a bonding layer after bonding is 5 MPa or more, metallic bonding starts to produce an effect on bonding at the interface. Shear strengths at the time of performing bonding using a bonding method according to the present invention and shear tests and the results of observing fracture surfaces are shown in Table 3. Sample I-(1) was formed using only silver oxide ($Ag_2O$) particles, sample I-(2) was formed by mixing 20 wt % of silver oxide ($Ag_2O$) and 80 wt % of myristyl alcohol, and sample I-(3) was formed by mixing 20 wt % of silver oxide ($Ag_2O$) and 80 wt % of myristyl alcohol. The fracture surface of sample I-(1) having a bonding strength of less than 5 MPa showed interfacial failure. In contrast, the fracture surface of each of samples I-(2) and I-(3) having shear strengths of 5 MPa or more showed failure in a sintered silver layer. If the fracture surface of a sample shows interfacial failure, bonding is mainly based on an anchor effect. On the other hand, if the fracture surface shows failure in a sintered silver layer, bonding is mainly based on metallic bonding. Accordingly, it is conceivable that metallic bonding starts to produce an effect if the shear strength at a bonding interface is 5 MPa or more.

[Table 3]

TABLE 3

| | Sample | | |
| --- | --- | --- | --- |
| | I-1 | I-2 | I-3 |
| Shear strength (MPa) | less than 5 | 5 or more | 5 or more |
| Fracture surface after shearing | interfacial failure | failure in sintered silver layer | failure in sintered silver layer |

Examples of the present invention will be described below with reference to the drawings.

EXAMPLE 1

In Example 1, silver oxide ($Ag_2O$) particles having an average particle diameter of about 2 μm were used, and myristyl alcohol (made by Wako Pure Chemical Industries, Ltd.) was used as an organic substance serving as a reducing agent.

FIG. 1 shows the result of thermogravimetric measurement of myristyl alcohol. The thermogravimetric measurement was performed using a TG/DTA6200 made by Seiko Instruments Inc. At this time, the measurement was performed at a rate of temperature rise of 10° C./min in the atmosphere. The result shows that the rate of weight loss versus temperature of myristyl alcohol at 244° C. was 99% or more. Myristyl alcohol and silver oxide ($Ag_2O$) particles were then mixed such that the mixing ratio was 1:4 by weight. Actually, a bonding material was produced using 0.8 g of silver oxide ($Ag_2O$) and 0.2 g of myristyl alcohol. Since myristyl alcohol is solid at room temperature, the myristyl alcohol was mixed with particles of the silver oxide ($Ag_2O$) for 10 minutes while being ground using a mortar. After the mixed powder was further mixed with 0.4 g of a toluene solution into paste form, it was vibrated for about 1 hour using a vibrating machine. With this operation, the silver oxide ($Ag_2O$) particles and myristyl alcohol were dispersed in the mixed solution.

Figure 2:
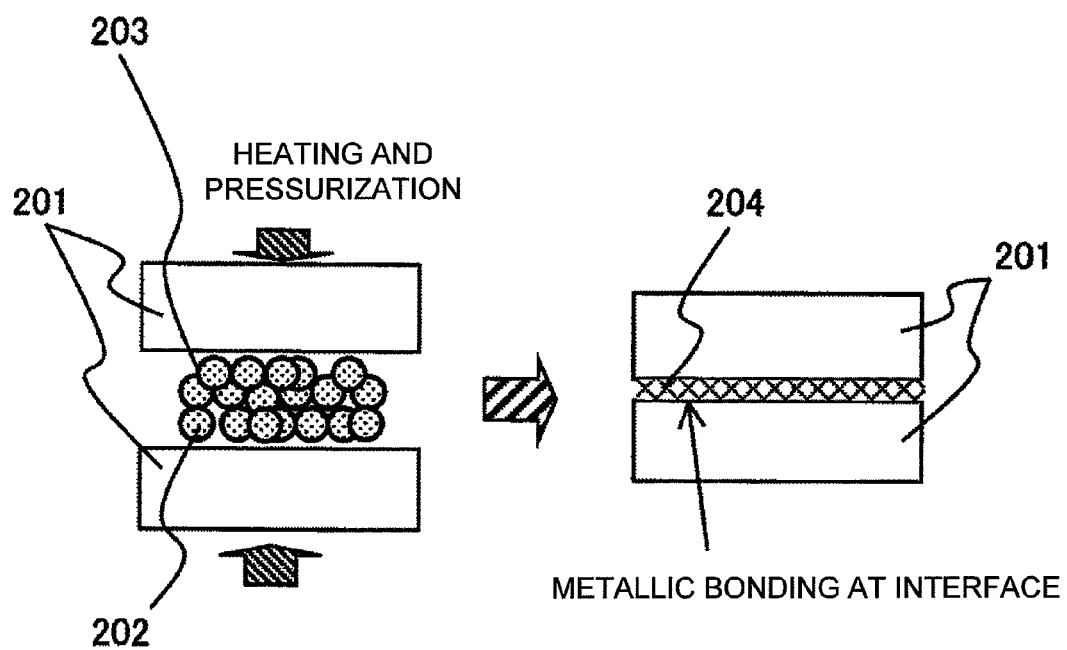
FIG. 2 is a view of the concept when bonding is performed using paste formed by dispersing silver oxide ($Ag_2O$) particles and myristyl alcohol in toluene.

After bonding was performed using the pasty solution, shear strength measurement was performed. Of test pieces used for measurement, the upper one was 5 mm in diameter and was 2 mm in thickness while the lower one was 10 mm in diameter and was 5 mm in thickness. The front surface of the lower test piece was plated with silver. After the pasty solution was applied to the lower test piece, it was dried at 60° C. for 5 minutes, and the toluene solution was evaporated. After that, the upper test piece was placed on the bonding material, and bonding was performed by applying heat and pressure. Conditions for the bonding were: bonding temperature, 250° C.; and bonding time, 2 minutes and 30 seconds. In order to examine the impact of the magnitude of applied pressure on bonding strength, the experiment was performed at varying pressures, zero pressure, 0.5 MPa, 1.0 MPa, and 2.5 MPa. As shown in the conceptual view in FIG. 2, if heat and pressure are applied, silver oxide particles 202 having particle diameters 100 nm or less are produced from a paste material between members 201 to be bonded, and the surface of each silver oxide particle 202 is coated with myristyl alcohol 203. When the myristyl alcohol 203 is decomposed and eliminated, the silver oxide particles 202 sinter to form a sintered silver layer 204. At this time, bonding by metallic bonding is achieved at a bonding interface between the sintered silver layer 204 and each of the members 201 to be bonded. The strength of a bonded portion under pure shear stress was measured using a sample obtained by bonding using the above-described bonding material. A Bond Tester SS-100 KP (maximum load capacity: 100 kg) made by Seishin Trading Co., Ltd. was used in each shear test. The shear rate was set to 30 mm/min. A pair of test pieces was ruptured using a shearing tool, and a maximum load at the time of rupture was measured. The maximum load was divided by a bonded area, and the quotient was regarded as a shear strength.

Figure 3:
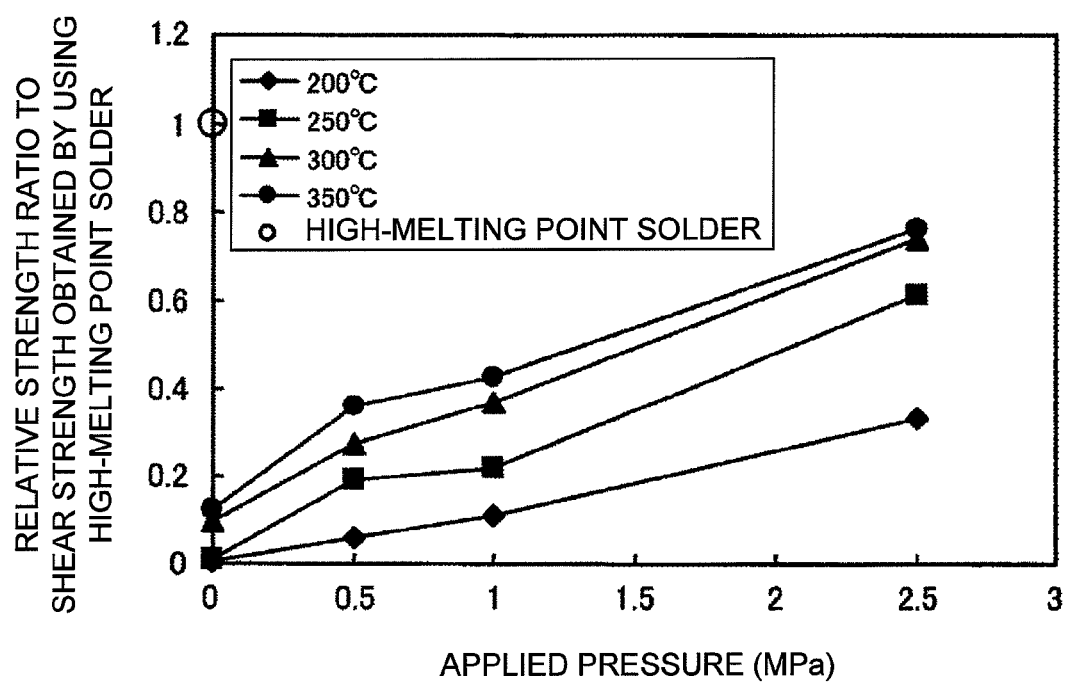
FIG. 3 is a graph showing the results of shear tests at varying applied pressures using a bonding material formed by mixing silver oxide ($Ag_2O$) particles and myristyl alcohol in the ratio of 4:1.

FIG. 3 shows changes in shear strength with respect to changes in pressure applied at the time of bonding. As for shear strength, the relative strength ratios of shear strengths obtained when bonding was performed using the bonding material according to this example to those obtained when bonding was performed using high-melting point solder by heating at a bonding temperature of 350° C. at zero pressure for 5 minutes are shown. The high-melting point solder was made of lead and tin and had a melting point between 280 and 300° C. FIG. 3 shows that shear strength increased with increase in the magnitude of applied pressure in this example (0.5, 1.0, . . . , 2.5 MPa). This is because increase in applied pressure causes closeness of a sintered silver layer during bonding and increase in contact area at an interface between the sintered silver layer and each of members to be bonded, which achieves metallic bonding over a larger area. FIG. 3 also shows that the bonding strength of a bonding material formed by mixing silver oxide ($Ag_2O$) particles and myristyl alcohol approaches that of high-melting point solder by increasing an applied pressure.

Figure 4:
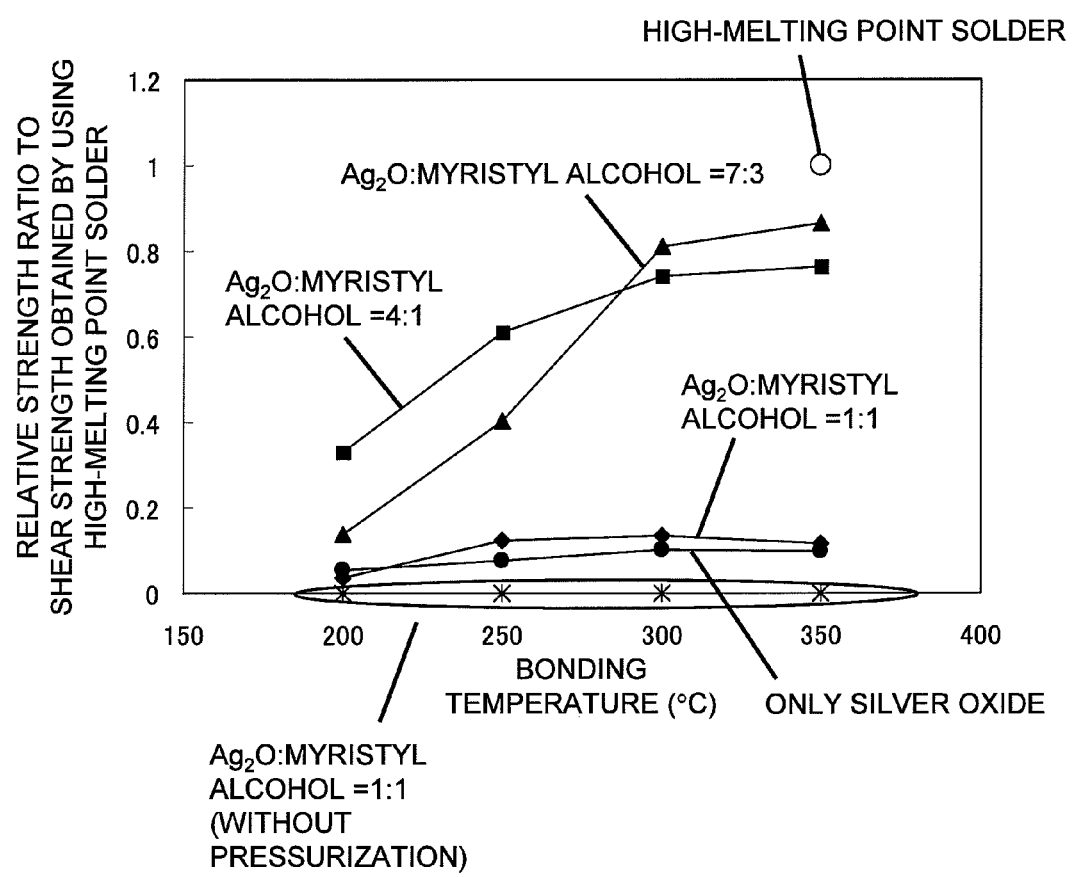
FIG. 4 is a graph showing the results of shear tests at varying mixing ratios between silver oxide ($Ag_2O$) particles and myristyl alcohol.

FIG. 4 shows the results of shear strength tests at varying mixing ratios between silver oxide ($Ag_2O$) particles and myristyl alcohol. The relative strength ratios of shear strengths obtained when bonding was performed at the varying mixing ratios to those obtained when bonding was performed using high-melting point solder are shown.

Mixing ratios between silver oxide ($Ag_2O$) and myristyl alcohol were 1:1, 4:1, and 7:3 by weight. A shear test using only silver oxide ($Ag_2O$) particles was also performed. At the time of these shear tests, bonding was performed by heating at 200, 250, 300, and 350° C. and pressurization at 2.5 MPa for 2.5 minutes. In addition, bonding was performed at each of temperatures of 200, 250, 300, and 350° C. without pressurization for 2.5 minutes, using a bonding material formed by mixing silver oxide ($Ag_2O$) and myristyl alcohol in the mixing ratio of 1:1. In the case where only silver oxide ($Ag_2O$) particles were used, high bonding strength arising from metallic bonding could not be obtained at any of the temperatures of 200, 250, 300, and 350° C. In the case of the mixing ratio of 7:3, at each of the lower temperatures of 200 and 250° C., the amount of a residue of myristyl alcohol was large, and high bonding strength could not be obtained. In contrast, at each of the high heating temperatures of 300 and 350° C., the amount of a residue of the reducing agent was small, and high shear strength was obtained. In the case of the mixing ratio of 4:1, higher shear strength was obtained at each of the lower temperatures, and bonding with comparable shear strength was obtained at each of the higher temperatures of 300 and 350° C., compared to the case of the mixing ratio of 7:3. As described above, if the amount of a metal particle precursor is 50% or less of that of a bonding material, the shear strength is low. On the other hand, if the amount of the metal particle precursor is more than 50% (e.g., 70% or 80%), high shear strength can be obtained. It is also clear that if the amount of the metal particle precursor is less than 50% of that of the bonding material, sufficient bonding strength cannot be obtained. The bonding material formed by mixing silver oxide ($Ag_2O$) and myristyl alcohol in the mixing ratio of 1:1 was hardly bonded without pressurization.

As can be seen from this, if the content of a metal particle precursor is 50 parts by mass or less per 100 parts by mass of a bonding material, firm bonding cannot be achieved regardless of the presence or absence of pressurization. The above experimental results show that the present invention is a technique achieved by causing a bonding material to contain 50 parts by mass or more of a metal particle precursor per 100 parts by mass of the bonding material and applying pressure.

EXAMPLE 2

In Example 2, bonding was performed using each of a bonding material (bonding material <1>) formed by mixing silver carbonate particles (made by Wako Pure Chemical Industries, Ltd.) having an average particle diameter of about 1 μm and myristyl alcohol in the weight ratio of 4:1, a bonding material (bonding material <2>) formed by mixing silver acetate particles (made by Wako Pure Chemical Industries, Ltd.) and myristyl alcohol in the weight ratio of 4:1, and a bonding material (bonding material <3>) formed by mixing silver oxide particles having an average particle diameter of about 2 μm and silver acetate particles (made by Wako Pure Chemical Industries, Ltd.) in the weight ratio of 4:1, and shear strength measurement was performed. Each pair of components was mixed using a mortar. Of test pieces for bonding, the upper one was 5 mm in diameter and was 2 mm in thickness while the lower one was 10 mm in diameter and was 5 mm in thickness. The front surface of the lower test piece was plated with silver. After each bonding material in powder form was applied to the lower test piece using a mask having a thickness of 100 μm, the upper test piece was placed on the bonding material. Bonding was performed by simultaneously applying heat and pressure. Conditions for the bonding were: applied pressure, 2.5 MPa; bonding temperatures, 200, 250, 300, and 350° C.; and bonding time, 2 minutes and 30 seconds.

The strength of a bonded portion under pure shear stress was measured using a sample obtained by bonding using each of the above-described bonding materials. A Bond Tester SS-100 KP (maximum load capacity: 100 kg) made by Seishin Trading Co., Ltd. was used in each shear test. The shear rate was set to 30 mm/min. A pair of test pieces was ruptured using a shearing tool, and a maximum load at the time of rupture was measured. The maximum load was divided by a bonded area, and the quotient was regarded as a shear strength.

Figure 5:
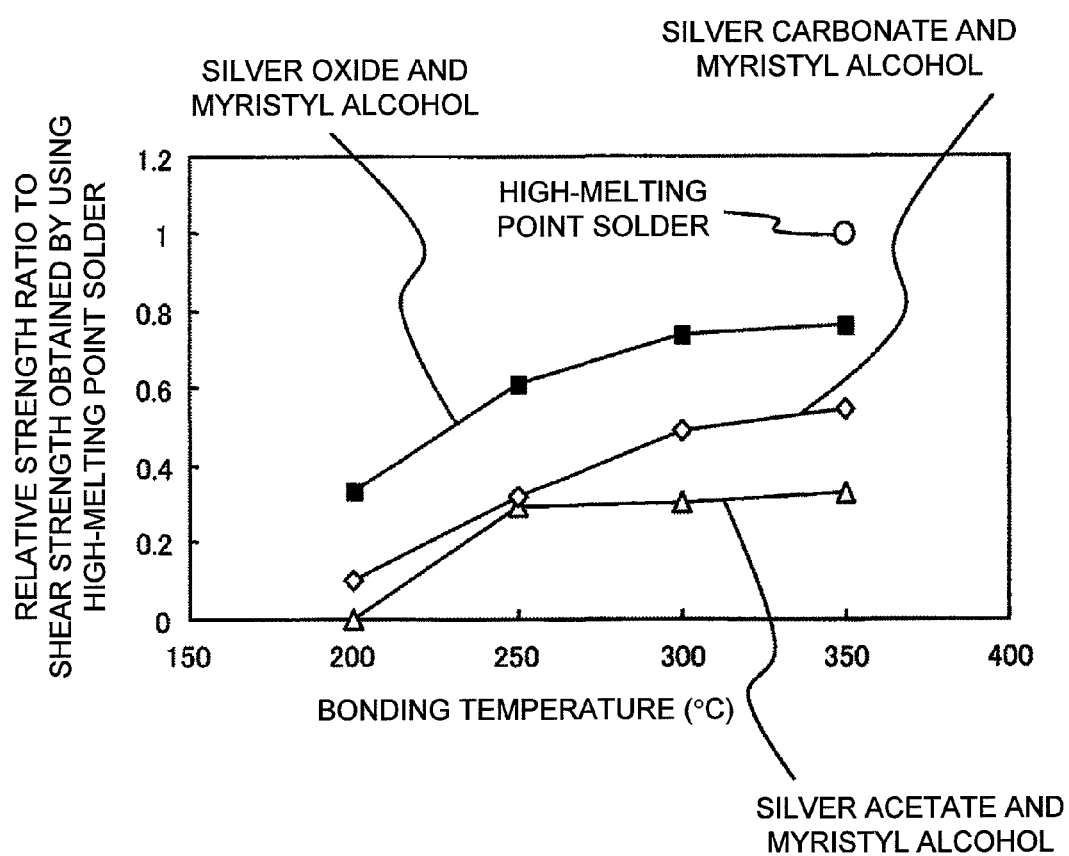
FIG. 5 is a graph showing shear strength versus bonding temperature when a bonding material formed by mixing silver carbonate particles and myristyl alcohol and a bonding material formed by mixing silver acetate particles and myristyl alcohol are used.

FIG. 5 shows the results of shear strength tests when bonding was performed using each of the above-described bonding materials. The relative strength ratios of shear strengths obtained when bonding was performed using each of the bonding materials according to this example to those obtained when bonding was performed by heating at a bonding temperature of 350° C. at zero pressure for 5 minutes using high-melting point solder which was made of lead and tin and had a melting point between 280 and 300° C. are shown, as in Example 1. For the sake of comparison, the results of a case where a bonding material (bonding material <4>) formed by mixing silver oxide and myristyl alcohol in the weight ratio of 4:1 was used are also shown. In the case of each of bonding materials <1> and <2>, bonding was not firm at each of the bonding temperatures of 200 and 250° C. while shear strength about half that of the high-melting point solder was obtained at the bonding temperature of 300° C.

In contrast, in the case of bonding material <3>, the bonding strength was comparable to that of bonding material <4> at each of the bonding temperatures of 200, 250, and 300° C., and higher bonding strength than that of the high-melting point solder was obtained at 350° C.

The bonded area ratios for bonding materials <1> to <4> are shown in Table 4. Evaluation of the ratios was performed by bonding a MOSFET device (size: 4×4×0.28 mm) which was made of Si and whose back surface was placed with silver and a lead frame whose front surface was plated with silver and which had a thickness of 0.3 mm. Conditions for the bonding were: temperature, 250° C.; applied pressure, 2.5 MPa; and bonding time, 2 minutes and 30 seconds. For each sample obtained in this manner, a bonded portion area after bonding was evaluated using an ultrasonic imaging device, HYE-FOCUS (made by Hitachi Kenki FineTech Co., Ltd.). Three samples were evaluated for each test condition. Pieces of information on a bonded portion and an unbonded portion can be derived from an image acquired by the above-described evaluation, as shown in FIG. 1. Letting $S_0$ be the area of the whole of a chip, and $S_1$ be the area of a bonded portion, a bonded portion area rate S (%) can be represented by $S_0/S_1$. By this method, the bonded portion area rate of each sample was calculated. The bonded area ratio for each bonding material refers to the ratio of the bonded area ratio of the bonding material to that of bonding material <4> taken as 1. As can be seen from Table 4, a bonded area ratio was the highest in the case where silver acetate was used as the reducing agent. As described above, to achieve reduction in voids and increase in bonded area ratio, use of silver acetate, which is a non-meltable reducing agent, is effective.

[Table 4]

TABLE 4

|  | Bonding material | | | |
|---|---|---|---|---|
|  | <1> | <2> | <3> | <4> |
| Bonded area ratio | 0.6 | 0.4 | 1.6 | 1.0 |

EXAMPLE 3

Figure 6:
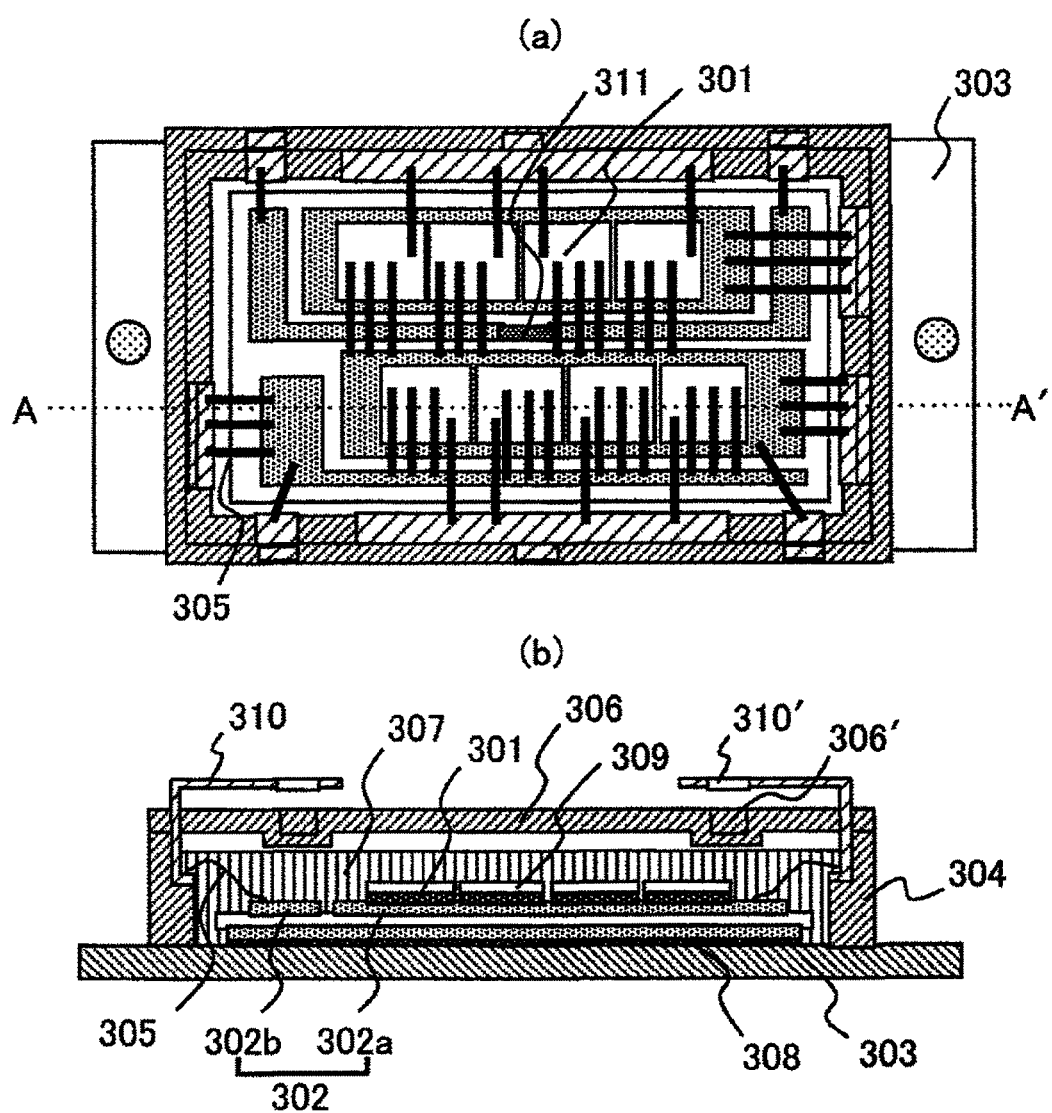
FIGS. 6(A) and 6(B) are views showing the structure of a non-insulated semiconductor apparatus serving as an example of the present invention.

FIGS. 6(A) and 6(B) are views showing the structure of a non-insulated semiconductor apparatus serving as an example of the present invention. FIG. 6(A) is a top view, and FIG. 6(B) is a sectional view of FIG. 6(A) taken along line A-A'. Semiconductor devices (MOSFET) 301 are mounted on a ceramic insulating substrate 302, and the ceramic insulating substrate 302 is mounted on a base material 303. After that, an epoxy resin case 304, bonding wires 305, and an epoxy resin lid 306 are provided, and the epoxy resin case 304 is filled with silicone gel resin 307. The ceramic insulating substrate 302 on the base material 303 is bonded through a bonding layer 308 composed of a paste material formed by dispersing silver oxide ($Ag_2O$) particles having an average particle diameter of about 2 μm and myristyl alcohol in the weight ratio of 4:1 in a toluene solution. Eight MOSFET devices 301 made of Si are bonded to copper plates 302a of the ceramic insulating substrate 302 through bonding layers 309 composed of the paste material formed by dispersing silver oxide ($Ag_2O$) particles and myristyl alcohol in toluene. The bonding through the bonding layers 308 and 309 composed of the paste material formed by dispersing silver oxide ($Ag_2O$) particles and myristyl alcohol in toluene is performed in the following manner. First, the paste material formed by dispersing silver oxide ($Ag_2O$) particles and myristyl alcohol in the weight ratio of 4:1 in a toluene solution is applied both to the copper plates 302a (plated with Ni) of the ceramic insulating substance 302 and the base material 303.

The semiconductor devices 301 and ceramic insulating substrate 302 are arranged on and connected to the bonding layers made of the paste material formed by dispersing silver oxide ($Ag_2O$) particles and myristyl alcohol in the weight ratio of 4:1 in toluene. At this time, bonding is performed at about 250° C. at an applied pressure of 1 MPa for 5 minutes.

Gate electrodes, emitter electrodes, and the like formed in the devices 301, the electrodes 302a and an electrode 302b formed on the insulating substrate 302, and terminals 310 attached to the epoxy resin case 304 in advance are wire-bonded by ultrasonic bonding using the Al wires 305 having a diameter of 300 μm. Reference numeral 311 denotes a thermistor device for temperature detection. The thermistor device 311 is composed of the bonding layer 309 made of the paste material formed by dispersing silver oxide ($Ag_2O$) particles and myristyl alcohol in toluene. The electrode 302b is wire-bonded to the corresponding terminal 310 using the Al wires 305 having the diameter of 300 μm to communicate with the outside.

Note that the epoxy resin case 304 and base material 303 are fixed to each other using silicone adhesive resin (not shown). Recesses 306' are formed in thick portions of the epoxy resin lid 306, and holes 310' are formed in the terminals 310, to allow screws (not shown) for connecting a non-insulated semiconductor apparatus 1000 to an external circuit to fit in. Each terminal 310 is formed by plating, with Ni, a copper plate which is stamped into a predetermined shape in advance and is formed and is attached to the epoxy resin case 304.

Figure 7:
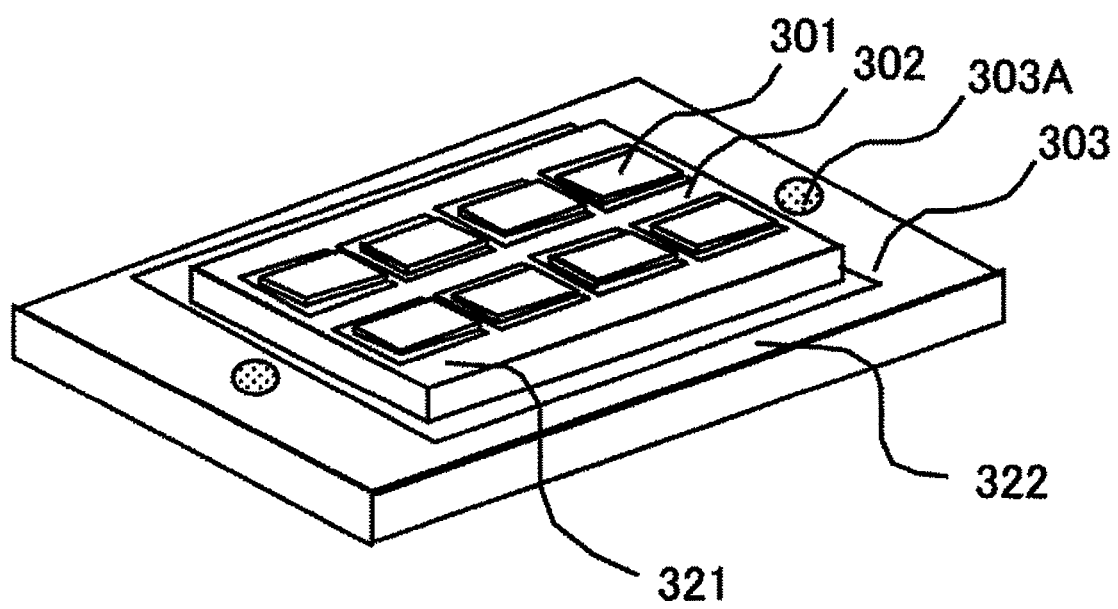
FIG. 7 is a view showing a subassembly portion of the non-insulated semiconductor apparatus of the present invention.

FIG. 7 is a view showing a subassembly portion of the non-insulated semiconductor apparatus of the present invention shown in FIGS. 6(A) and 6(B). The ceramic insulating substrate 302 and semiconductor devices 301 are mounted on the composite 303 serving as the base material. Mounting holes 303A are formed in the periphery of the base material. The base material is made of Cu and its front surface is plated with Ni. The ceramic insulating substrate 302 is mounted on the base material 303 through the pasty layer formed by dispersing silver oxide ($Ag_2O$) particles and myristyl alcohol in the weight ratio of 4:1 in toluene. The MOSFET devices 301 are mounted on the ceramic insulating substrate 302 through the pasty layers formed by dispersing silver oxide ($Ag_2O$) particles and myristyl alcohol in toluene.

Figure 8:
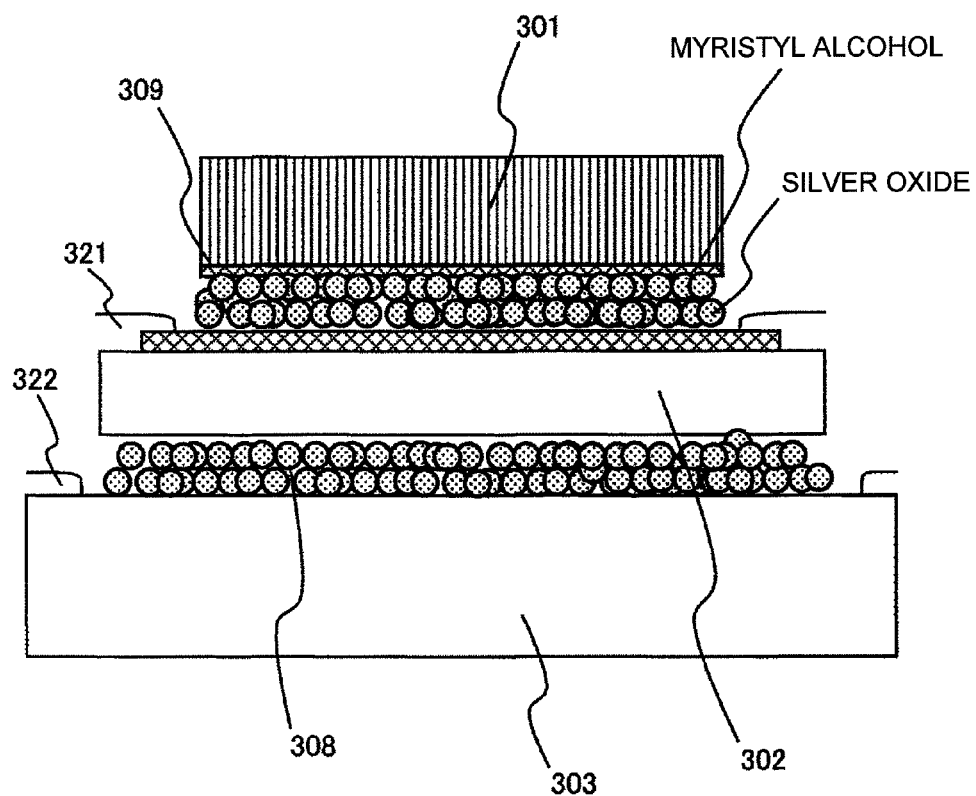
FIG. 8 is an enlarged schematic view of a semiconductor device and a substrate bonded portion.

FIG. 8 is an enlarged schematic view of a section of a MOSFET device mounting portion in FIG. 7 before bonding. As shown in FIG. 8, a paste material formed by dispersing silver oxide ($Ag_2O$) particles and myristyl alcohol in the weight ratio of 4:1 in toluene can be used for a bonding layer. To prevent a solution from running at the time of applying the paste material formed by dispersing silver oxide ($Ag_2O$) particles and myristyl alcohol in toluene in Example 1, a repellent film 322 is provided on the base material 303 for a region in which the ceramic insulating substrate 302 is mounted. A repellent film 321 is further provided on the ceramic insulating substrate 302 for a region in which the semiconductor device 301 is mounted, thereby preventing a solution from running at the time of applying the paste.

EXAMPLE 4

Figure 9:
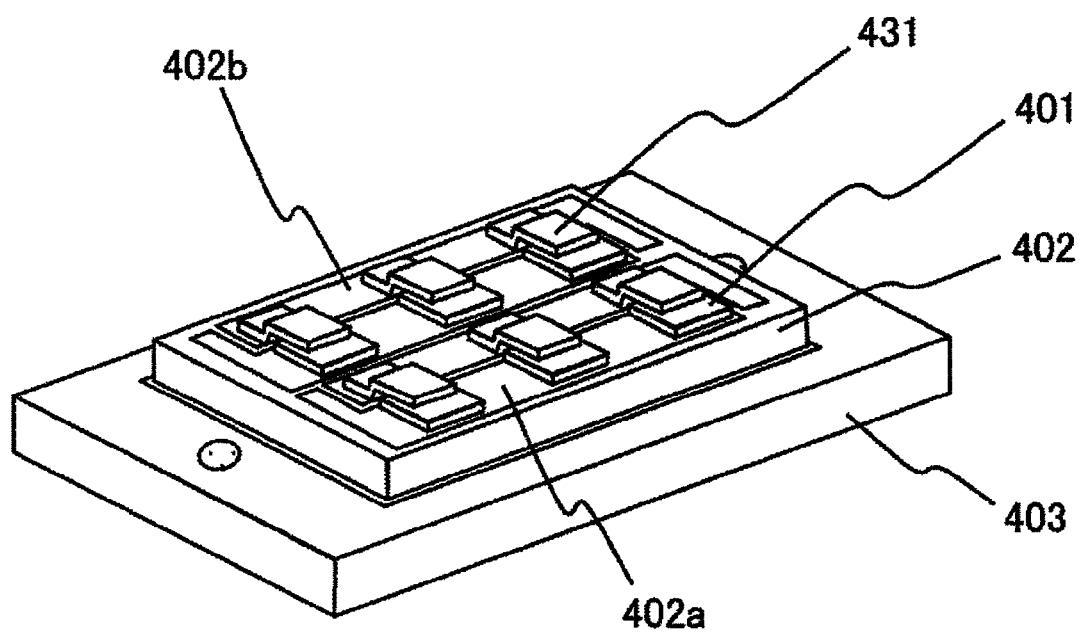
FIG. 9 is a view showing the structure of another example of a subassembly portion of a non-insulated semiconductor apparatus.

FIG. 9 is a view showing another example of a non-insulated semiconductor apparatus according to the present invention.

Semiconductor devices 401 and a ceramic insulating substrate 402 are bonded together through bonding layers made of a paste material formed by dispersing silver oxide ($Ag_2O$) particles having an average particle diameter of about 2 μm and myristyl alcohol in the weight ratio of 4:1 in toluene, as in Example 3. An emitter electrode of each semiconductor device 401 is connected to a copper wire 402b which is formed on the ceramic insulating substrate 402 and whose front surface is plated with Au and Ni through a connecting terminal 431, and the a copper wire 402b is connected to the connecting terminal 431 through a particle layer made of the paste material formed by dispersing silver oxide ($Ag_2O$) particles and myristyl alcohol in the weight ratio of 4:1 in toluene.

Figure 10:
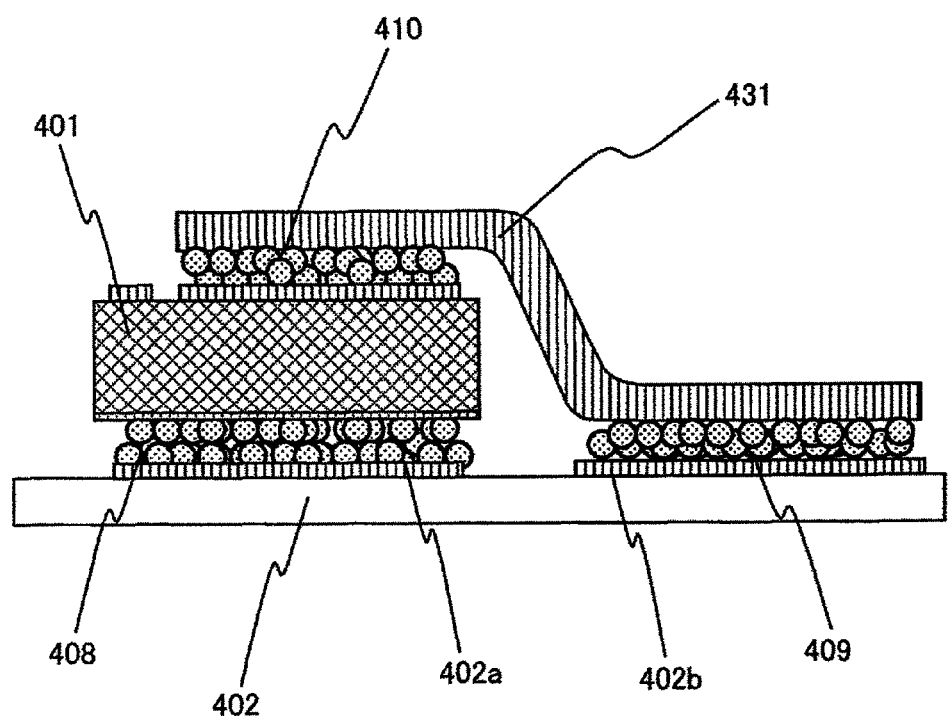
FIG. 10 is an enlarged schematic view of a semiconductor device and a substrate bonded portion.

FIG. 10 is an enlarged schematic view of a section of a semiconductor device mounting portion in FIG. 9 before bonding. A copper plate which is plated with Ni and is further plated with gold is used as the connecting terminal 431. After the semiconductor device 701 is mounted on a copper wire 402a of the insulating substrate 402, the paste material formed by dispersing silver oxide ($Ag_2O$) particles and myristyl alcohol in the weight ratio of 4:1 in toluene is placed on an emitter electrode (the upper side) of the semiconductor device 401. The sheet material is placed on a Au-plated portion of the copper wire 402b, which is a copper wiring pattern formed on the ceramic insulating substrate 402, whose front surface is plated with Ni, and in which a portion to be connected to the emitter electrode of the semiconductor device 401 through the connecting terminal 431 is plated with Au. After that, the connecting terminal 431 is mounted on the paste material formed by dispersing silver oxide ($Ag_2O$) particles and myristyl alcohol in the weight ratio of 4:1 in toluene above the electrode, heat of about 250° C. is applied under a pressure of 0.5 MPa for 5 minutes. With this operation, connection between the semiconductor device 401 and the copper wire 402b is completed. Since a large current flows not only through a collector electrode but also an emitter electrode in an insulated semiconductor apparatus, use of the connecting terminal 431 with a large wiring width makes it possible to further improve the connection reliability on the emitter electrode side.

EXAMPLE 5

Figure 11:
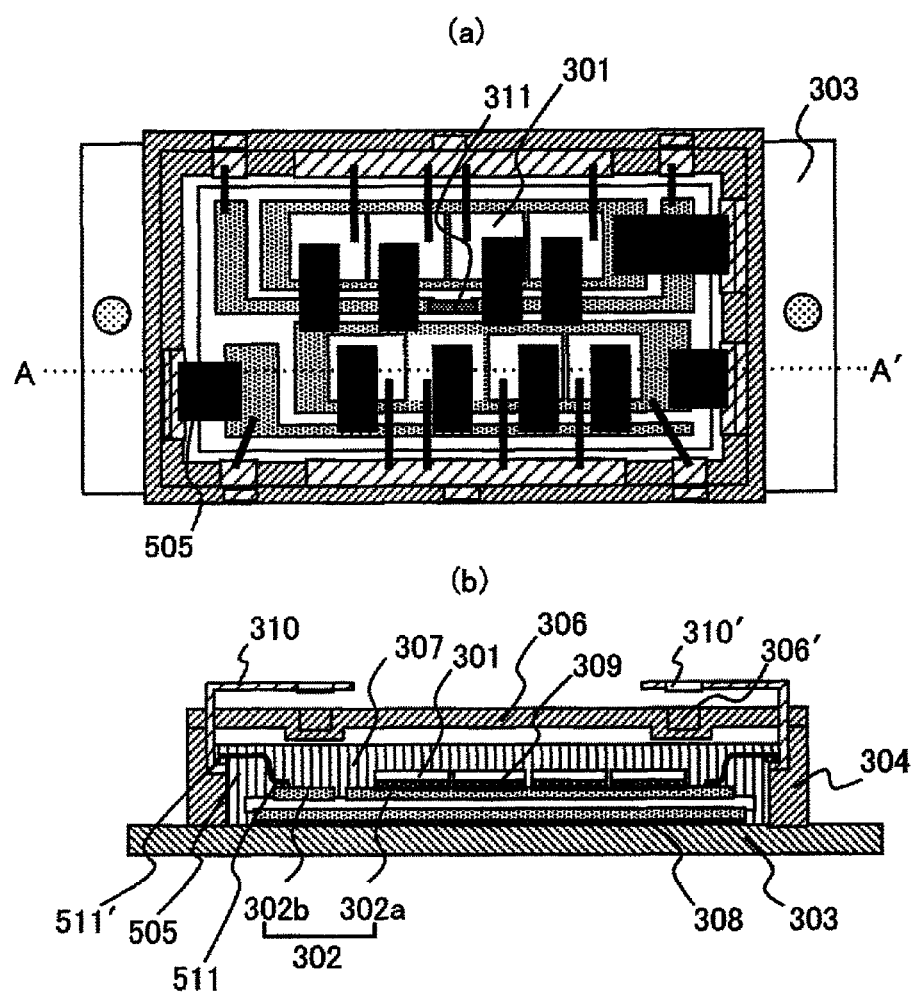
FIGS. 11(A) and 11(B) are views showing the structure of a non-insulated semiconductor device serving as an example of the present invention and views of a case where bonding of clip-shaped terminals is performed using a bonding material according to the present invention instead of bonding wires.

FIGS. 11(A) and 11(B) are views showing the structure of a non-insulated semiconductor apparatus similar to that in Example 3. In this example, clip-shaped connecting terminals 505 are used instead of the bonding wires 305 in Example 3.

Gate electrodes, emitter electrodes, and the like formed in devices 301, electrodes 302a and 302b formed on an insulating substrate, and terminals 310 attached to an epoxy resin case 4 in advance are bonded by placing the clip-shaped connecting terminals 505 on bonding layers 511 and 511' made of a paste material formed by dispersing silver oxide ($Ag_2O$) and myristyl alcohol in the weight ratio of 4:1 in toluene and heating the clip-shaped terminals 505 at 250° C. under a load of about 0.1 MPa for 2 minutes.

EXAMPLE 6

An insulated semiconductor apparatus as a high-frequency power amplifier used in a transmission unit of a cellular phone handset or the like will be described in this example.

Figure 12:
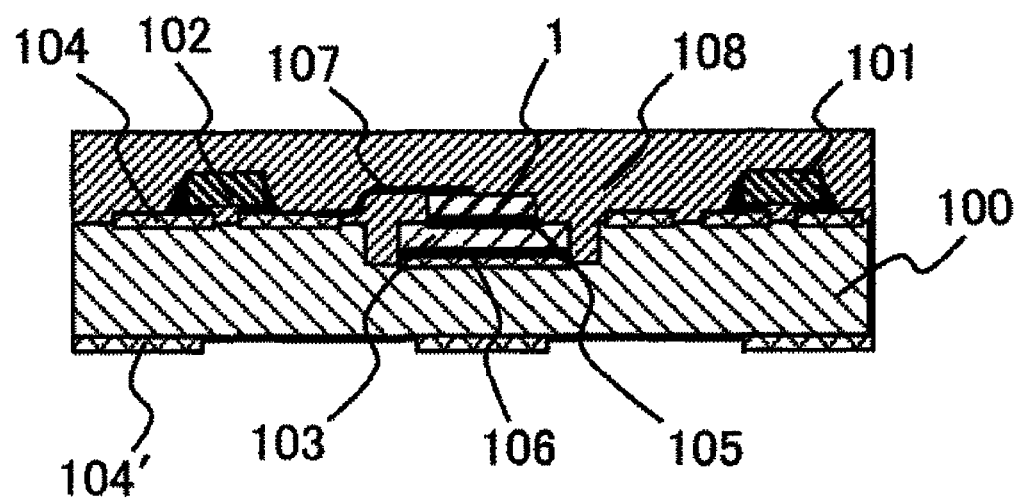
FIG. 12 is a schematic sectional view of an insulated semiconductor apparatus according to an example.

An insulated semiconductor apparatus (size: 10.5×4×1.3 mm) according to this example includes the components below. FIG. 12 is a schematic sectional view of the insulated semiconductor apparatus of this example. Chip components including a MOSFET device (size: 2.4×1.8×0.24 mm) 1, a chip resistor (about 7 ppm/° C.) 101, and a chip capacitor (about 11.5 ppm/° C.) 102 are mounted on a multilayer glass-ceramic substrate (size: 10.5×4×0.5 mm, three-layer wiring, coefficient of thermal expansion: 6.2 ppm/° C., thermal conductivity: 2.5 W/m·K, bending strength: 0.25 GPa, Young's modulus: 110 GPa, permittivity: 5.6 (1 MHz)) as a support member 100. An intermediate metal member 103 made of, e.g., a Cu—$Cu_2O$ composite is arranged between the MOSFET device 1 and the multilayer glass-ceramic substrate 100. A thick-film internal wiring layer (Ag-1 wt % Pt, thickness: 15 μm), a thick-film through-hole conductor for electrical connection between the multiple wiring layers (Ag-1 wt % Pt, diameter: 140 μm), and a thick-film thermal via for a heat dissipation path (Ag-1 wt % Pt, diameter: 140 μm) are provided in the multilayer glass-ceramic substrate 100. A thick-film wiring pattern (Ag-1 wt % Pt, thickness: 15 μm) 104 is provided on one principal surface of the multilayer glass-ceramic substrate 100. The chip components including the chip resistor 101 and chip capacitor 102 are conductively fixed on the thick-film wiring pattern 104 through sintered silver layers 105 by applying a bonding material formed by mixing silver oxide ($Ag_2O$) particles having an average particle diameter of about 2 μm and ascorbic acid in the weight ratio of 4:1 using a mortar to the thick-film wiring pattern 104 and applying a load of 0.5 MPa to the chip components at 300° C. for 2 minutes. The MOSFET device (Si, 3.5 ppm/° C.)

1 is mounted in a recess formed in the one principal surface of the multilayer glass-ceramic substrate 100 through the intermediate metal member 103. The mounting is performed in a vacuum ($10^{-3}$). The size of the intermediate metal member 103 is 2.8×2.2×0.2 mm. The sintered silver layer 105 connecting the MOSFET device 1 and intermediate metal member 103 and a bonding layer 106 connecting the intermediate metal member 103 and multilayer glass-ceramic substrate 100 are each a layer obtained using the bonding material formed by mixing silver oxide ($Ag_2O$) particles having an average particle diameter of about 2 μm and ascorbic acid in the weight ratio of 4:1. A clip-shaped connecting terminal 107 made of Cu is bonded between predetermined portions of the MOSFET device 1 and thick-film wiring pattern 104 using the bonding material formed by mixing silver oxide ($Ag_2O$) particles and ascorbic acid in the weight ratio of 4:1. At this time, the bonding is performed by applying a load of 0.1 MPa to the clip 107 at 300° C. for 2 minutes. A thick-film external electrode layer (Ag-1 wt % Pt, thickness: 15 μm) 104' is provided on the other principal surface of the multilayer glass-ceramic substrate 100. The thick-film external electrode layer 104' is electrically connected to the thick-film wiring pattern 104 via the internal wiring layer and through-hole wiring provided in the multilayer glass-ceramic substrate 100. An epoxy resin layer 108 is provided on the one principal surface of the multilayer glass-ceramic substrate 100 to seal the mounted chip components and the like.

EXAMPLE 7

A non-insulated semiconductor apparatus which uses a composite for a lead frame for a mini-mold type transistor will be described in this example.

Figure 13:
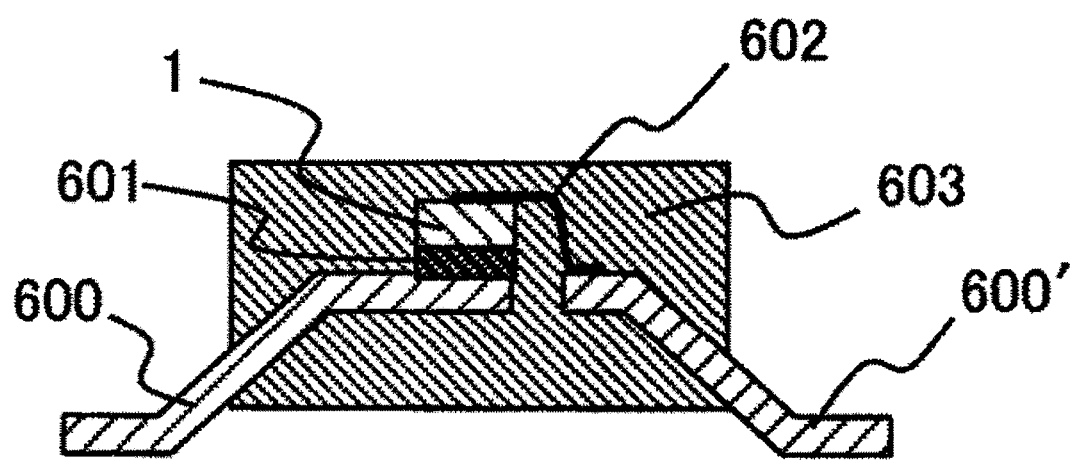
FIG. 13 is a schematic sectional view of a mini-mold type non-insulated semiconductor apparatus according to an example.

FIG. 13 is a schematic sectional view of a mini-mold type non-insulated semiconductor apparatus according to this example. A transistor device (size: 1×1×0.3 mm) made of Si as a semiconductor device 1 is bonded through a sintered silver layer 601 by applying a bonding material formed by mixing silver carbonate having an average particle diameter of about 1 μm and tetradecanoic acid in the weight ratio of 4:1 using a mortar to a lead frame (thickness: 0.3 mm) 600 made of, e.g., a Cu—$Cu_2O$ composite and heating the transistor device at 300° C. under a load of 2.0 MPa for 2 minutes. A collector of the transistor device 1 is arranged on the side where the transistor device 1 is bonded to the lead frame 600 using the bonding material formed by mixing silver carbonate and tetradecanoic acid in the weight ratio of 4:1 using a mortar. An emitter and a base of the transistor device 1 are provided on the side opposite to the side where the transistor device 1 is bonded using silver carbonate and myristyl alcohol. The emitter and base are bonded through a clip-shaped terminal 602 led out from the transistor device 1 by applying a bonding material formed by mixing silver oxide ($Ag_2O$) particles having an average particle diameter of about 2 μm and myristyl alcohol in the weight ratio of 9:1 to a lead frame 600 and applying a load of 1.0 MPa to the clip-shaped terminal 602 at 250° C. for 2 minutes. A main portion in which the transistor device 1 is mounted, and the clip-shaped terminal 602 is provided is covered with epoxy resin 603 by transfer molding. The lead frames 600 and 600' are cut off upon completion of the molding using the epoxy resin 603 to serve as independent terminals.

EXAMPLE 8

Bonding is performed using a bonding material according to the present invention at the time of mounting an LED on a board. This makes it possible to make heat dissipation higher than those of a conventional solder material and thermally conductive adhesive material.

What is claimed is:

1. A bonding material comprising a metal particle precursor comprising particles of a metal oxide having an average particle diameter of not less than 1 μm and not more than 50 μm and a reducing agent comprising a metal carboxylate having a melting point of 200° C. or more, wherein content of the metal particle precursor is more than 50 parts by mass and not more than 99 parts by mass per 100 parts by mass of the bonding material, and wherein content of the reducing agent is 1 to 50 parts by mass per 100 parts by mass of the metal particle precursor.

2. The bonding material according to claim 1, wherein the metal oxide is an oxide of one of gold, silver, and copper.

3. A paste bonding material comprising a metal particle precursor comprising particles of a metal oxide having an average particle diameter of not less than 1 μm and not more than 50 μm, a reducing agent comprising a metal carboxylate having a melting point of 200° C. or more, and a solvent, wherein content of the reducing agent is 1 to 50 parts by mass per 100 parts by mass of the metal particle precursor.

4. A bonding method comprising arranging a bonding material comprising a metal particle precursor comprising particles of a metal oxide having an average particle diameter of not less than 1 μm and not more than 50 μm and a reducing agent comprising a metal carboxylate having a melting point of 200° C. or more, wherein content of the reducing agent is 1 to 50 parts by mass per 100 parts by mass of the metal particle precursor between an electrode of a semiconductor device and a metal member, and bonding the electrode of the semiconductor device and the metal member together by heating at a temperature lower than the melting temperature of the metal carboxylate and pressurization.

5. The bonding method according to claim 4, wherein heat of not less than 40° C. and not more than 400° C. and a pressure of more than 0 MPa and less than 10 MPa are applied.

6. The bonding method according to claim 4, wherein the metal particle precursor is reduced by the heating to produce a metal particle having an average particle diameter of not more than 100 nm.

7. The bonding material according to claim 1, further comprising scaly silver and thermosetting resin.

8. The bonding method according to claim 4, wherein the heating and pressurization provide a sintered metal layer bonding the electrode of the semiconductor device and the metal member together.

9. The bonding method according to claim 8, wherein the sintered metal layer comprises metal particles having particle diameters of 100 nm or less.

10. The bonding method according to claim 9, wherein heat of not more than 200° C. is applied.

11. The bonding method according to claim 9, wherein the metal particles do not have an organic substance on their surfaces.

12. The bonding method according to claim 9, wherein the metal carboxylate is silver acetate.

13. The bonding material according to claim 1, wherein the metal carboxylate is silver acetate.

14. The paste bonding material according to claim 3, wherein the metal carboxylate is silver acetate.

* * * * *